(12) United States Patent
Laurino et al.

(10) Patent No.: US 9,030,220 B2
(45) Date of Patent: May 12, 2015

(54) VOLTAGE TESTER HAVING ALTERNATIVELY ATTACHABLE OR SEPARABLE PROBES

(75) Inventors: Ferdinand Laurino, Seattle, WA (US); Duncan Nigel Kearsley, Stanwood, WA (US); Wilbur R. Ames, IV, Lake Stevens, WA (US)

(73) Assignee: Fluke Corporation, Everett, WA (US)

( * ) Notice: Subject to any disclaimer, the term of this patent is extended or adjusted under 35 U.S.C. 154(b) by 612 days.

(21) Appl. No.: 13/271,297

(22) Filed: Oct. 12, 2011

(65) Prior Publication Data
US 2013/0093448 A1  Apr. 18, 2013

(51) Int. Cl.
*G01R 31/20* (2006.01)
*G01R 1/04* (2006.01)
*G01R 1/067* (2006.01)
*G01R 19/155* (2006.01)

(52) U.S. Cl.
CPC .............. *G01R 1/04* (2013.01); *G01R 1/06788* (2013.01); *G01R 19/155* (2013.01)

(58) Field of Classification Search
USPC ........................................................ 324/72.5
See application file for complete search history.

(56) References Cited

U.S. PATENT DOCUMENTS

| | | | |
|---|---|---|---|
| 2,791,748 A | 5/1957 | Mitchell | |
| 2,842,741 A * | 7/1958 | Simkins | 324/149 |
| 3,555,420 A * | 1/1971 | Schwartz | 324/149 |
| 4,079,314 A | 3/1978 | Jone | |
| 4,152,639 A | 5/1979 | Chaffee | |
| 4,259,635 A | 3/1981 | Triplett | |
| 4,298,837 A | 11/1981 | Koslar | |
| 4,476,721 A | 10/1984 | Hochreuther et al. | |
| 4,696,189 A | 9/1987 | Hochreuther | |
| 5,029,296 A * | 7/1991 | Shang-Wen | 324/156 |
| D337,281 S | 7/1993 | Bohmer | |
| 5,481,185 A | 1/1996 | Lane et al. | |
| 6,137,285 A * | 10/2000 | Walsten et al. | 324/133 |
| 6,605,934 B1 | 8/2003 | Campbell et al. | |

(Continued)

FOREIGN PATENT DOCUMENTS

| | | |
|---|---|---|
| CN | 1116605 A | 2/1996 |
| DE | 3125552 C1 | 11/1982 |

(Continued)

OTHER PUBLICATIONS

Fluke Model T50 Voltage/Continuity Tester Users Manual, PN2438510, May 2005.

(Continued)

*Primary Examiner* — Minh N Tang
(74) *Attorney, Agent, or Firm* — Christensen O'Connor Johnson Kindness PLLC

(57) ABSTRACT

A tester includes a main body and a removable probe. The main body includes a main body probe and a front panel including selectable options for selecting a tester function. The removable probe may be coupled to the main body via a cord. The removable probe is fixable to the main body via a latch assembly. The latch assembly including a socket disposed on one of the removable probe or the main body and a mating protrusion disposed at the other of the removable probe or the main body, the main body having a probe support ridge associated therewith and the removable probe having an alignment ridge associated therewith, the alignment ridge and the probe support ridge lying in a same plane when the mating protrusion is inserted into the socket.

17 Claims, 10 Drawing Sheets

(56) References Cited

U.S. PATENT DOCUMENTS

| | | | |
|---|---|---|---|
| 6,949,919 B1* | 9/2005 | Cannon | 324/72.5 |
| 7,242,173 B2 | 7/2007 | Cavoretto | |
| 7,741,835 B2* | 6/2010 | Tan et al. | 324/755.01 |
| 7,746,051 B1* | 6/2010 | Buchanan et al. | 324/72.5 |
| 2006/0043959 A1 | 3/2006 | Caboretto | |
| 2009/0146644 A1 | 6/2009 | Tan et al. | |
| 2009/0189597 A1* | 7/2009 | Lagerberg et al. | 324/133 |
| 2011/0309853 A1* | 12/2011 | Tan | 324/755.01 |
| 2013/0093449 A1* | 4/2013 | Laurino et al. | 324/754.11 |

FOREIGN PATENT DOCUMENTS

| | | |
|---|---|---|
| DE | 29815829 U1 | 3/1999 |
| DE | 202010015761 U1 | 1/2011 |
| EP | 1164379 A1 | 12/2001 |
| GB | 1565218 A | 4/1980 |

OTHER PUBLICATIONS

Fluke Model T100, T120, T140, VDE Voltage/Continuity Tester Users Manual, Nov. 2006.

Search Report and Written Opinion of corresponding European application No. 121729941 mailed Jan. 4, 2013.

Search Report and Written Opinion for European patent application No. 12173246.5 mailed Jan. 7, 2013, (which corresponds to U.S. Appl. No. 13/271,499, filed Oct. 12, 2011).

Application papers for U.S. Appl. No. 13/271,499, filed Oct. 12, 2011.

Chinese Office Action date Jul. 3, 2014, in Chinese Patent Application No. CN 201210370035.5, filed Sep. 27, 2012, 19 pages.

Chinese Office Action dated Sep. 3, 2014, in Chinese Application 201210278227.3, filed Aug. 7, 2012, 23 pages.

* cited by examiner

VOLTAGE TESTER HAVING ALTERNATIVELY ATTACHABLE OR SEPARABLE PROBES

BACKGROUND OF THE INVENTION

The present invention relates generally to handheld voltage and continuity testers. More particularly, the invention relates to a handheld voltage tester having an improved structure for the meter case such that the probes are alternately attachable in fixed positions relative to one another or separable from each other.

Handheld voltage testers support testing and measurement in multiple handicraft and industrial applications, as well as household uses. These testers often provide a device that is relatively easy to use and handle in order to perform voltage testing and, in some cases, continuity or resistance.

Some handheld voltage testers are configured as units having two probes. In some cases, one probe may be provided on a main body and the other probe may be connected to the main body via a cord. Although some snap connections have been developed to enable the probes to be held together when not in use, these connections are typically not very robust. Accordingly, the probes may be unwieldy to handle or difficult to manage in some situations.

SUMMARY OF THE INVENTION

According to one example embodiment, a tester is provided. The tester includes a main body and a removable probe. The main body includes a main body probe and a front panel including selectable options for selecting a tester function. The removable probe may be coupled to the main body via a cord. The removable probe is fixable to the main body via a latch assembly. The latch assembly including a socket disposed on one of the removable probe or the main body and a mating protrusion disposed at the other of the removable probe or the main body, the main body having a probe support ridge associated therewith and the removable probe having an alignment ridge associated therewith, the alignment ridge and the probe support ridge lying in a same plane when the mating protrusion is inserted into the socket.

In some example embodiments, the front panel includes a readout panel comprising a series of lights that selectably provide backlight to numbered values defined on the readout panel based on readings measured using the main body probe and the removable probe. In some cases, the front panel and the removable probe each include test feature buttons selectable to initiate test procedures.

Exemplary embodiments are contemplated in which the mating protrusion comprises an arcuate groove disposed around at least two sides of a base thereof to form cantilevered extension portions that at least extend along a longitudinal length of the main body. In some embodiments, the socket comprises a right side sheath body and a left side sheath body that each extend from opposite sides of the socket outward away from the removable probe and then fold toward each other to define a receiving space in the socket to receive the mating protrusion.

In some example embodiments, the alignment ridge may extend radially outward from the removable probe in a plane substantially perpendicular to a longitudinal axis of the removable probe. The alignment ridge may include an edge that fits snugly against a mating surface of the main body to inhibit forward movement of the removable probe when the mating protrusion is disposed in the socket.

An additional example embodiment may include the main body having a probe support ridge extending radially outward from at least a portion of the main body and lying in a plane that is substantially perpendicular to a longitudinal axis of the main body. In some embodiments, the probe support ridge extends at least over a back panel of the main body and a side panel of the main body that is proximate to the removable probe when the removable probe is fixed to the main body via the latch assembly. In an example embodiment, the probe support ridge supports a back portion of the removable probe to inhibit rearward motion of the removable probe when the removable probe is fixed to the main body via the latch assembly.

In some cases, each of the removable probe and the main body probe include corresponding lead tips, and the lead tips of the removable probe and the main body probe may be substantially even in a longitudinal direction when the removable probe is fixed to the main body via the latch assembly. In an example embodiment, each of the removable probe and the main body probe include corresponding lead tips, and the lead tips of the removable probe and the main body probe are disposed a predetermined distance from each other when the removable probe is fixed to the main body via the latch assembly. In some situations, the predetermined distance corresponds to a distance between receptacle slots for receiving power plugs.

According to another aspect, an example embodiment provides a method of assembling a tester. The method may include providing a main body including a main body probe and a front panel including selectable options for selecting a tester function, coupling a removable probe the main body via a cord, and providing a latch assembly to enable fixing the removable probe to the main body. The latch assembly may include a socket disposed on one of the removable probe or the main body and a mating protrusion disposed at the other of the removable probe or the main body. The main body may have a probe support ridge associated therewith and the removable probe having an alignment ridge associated therewith. The alignment ridge and the probe support ridge may lie in a same plane when the mating protrusion is inserted into the socket. In some embodiments, providing the latch assembly further comprises providing the mating protrusion to include an arcuate groove disposed around at least two sides of a base thereof to form cantilevered extension portions that at least extend along a longitudinal length of the main body. In an example embodiment, providing the latch assembly further comprises providing the socket to include a right side sheath body and a left side sheath body that each extend from opposite sides of the socket outward away from the removable probe and then fold toward each other to define a receiving space in the socket to receive the mating protrusion.

Other objects, features and aspects of the present invention are provided by various combinations and subcombinations of the disclosed elements, as well as methods of practicing same, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
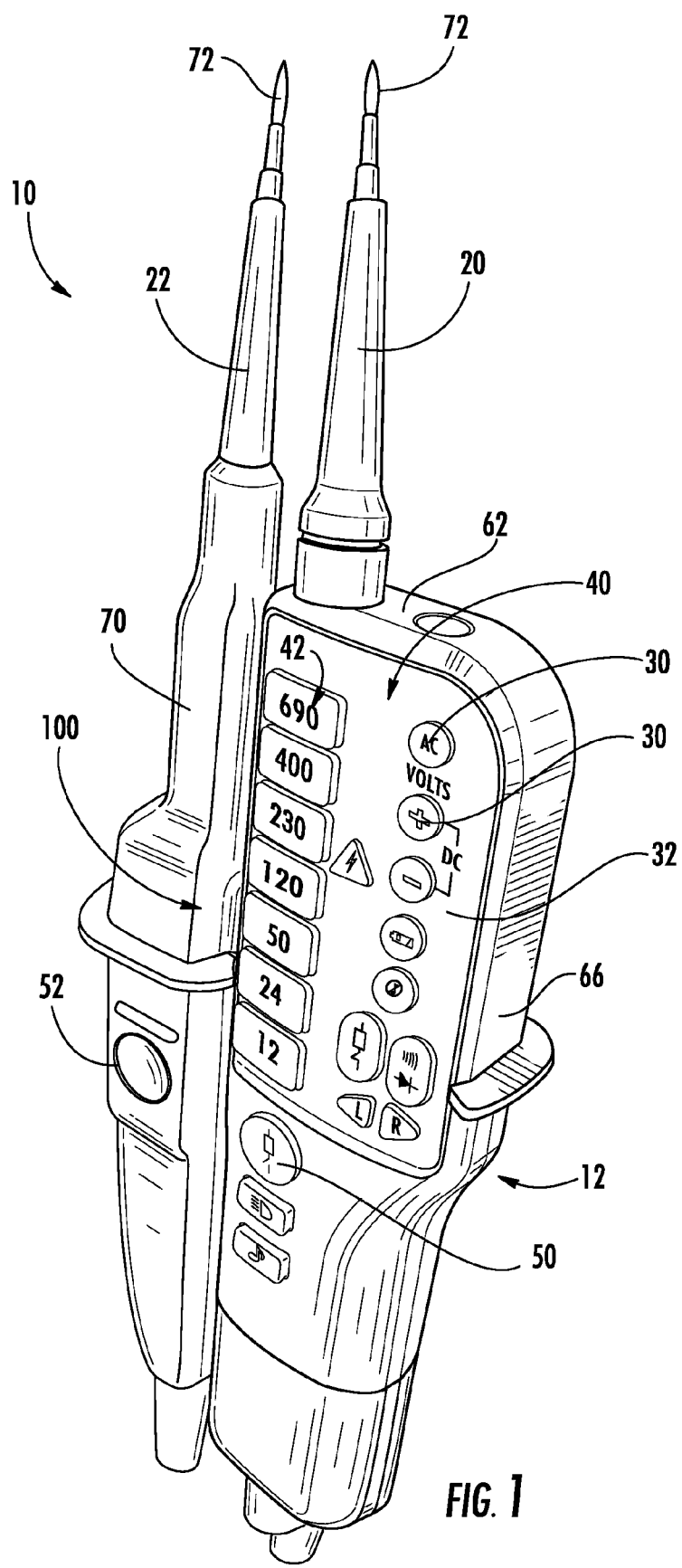
FIG. 1 is a perspective view of a voltage tester constructed in accordance with the present invention.
Figure 2:
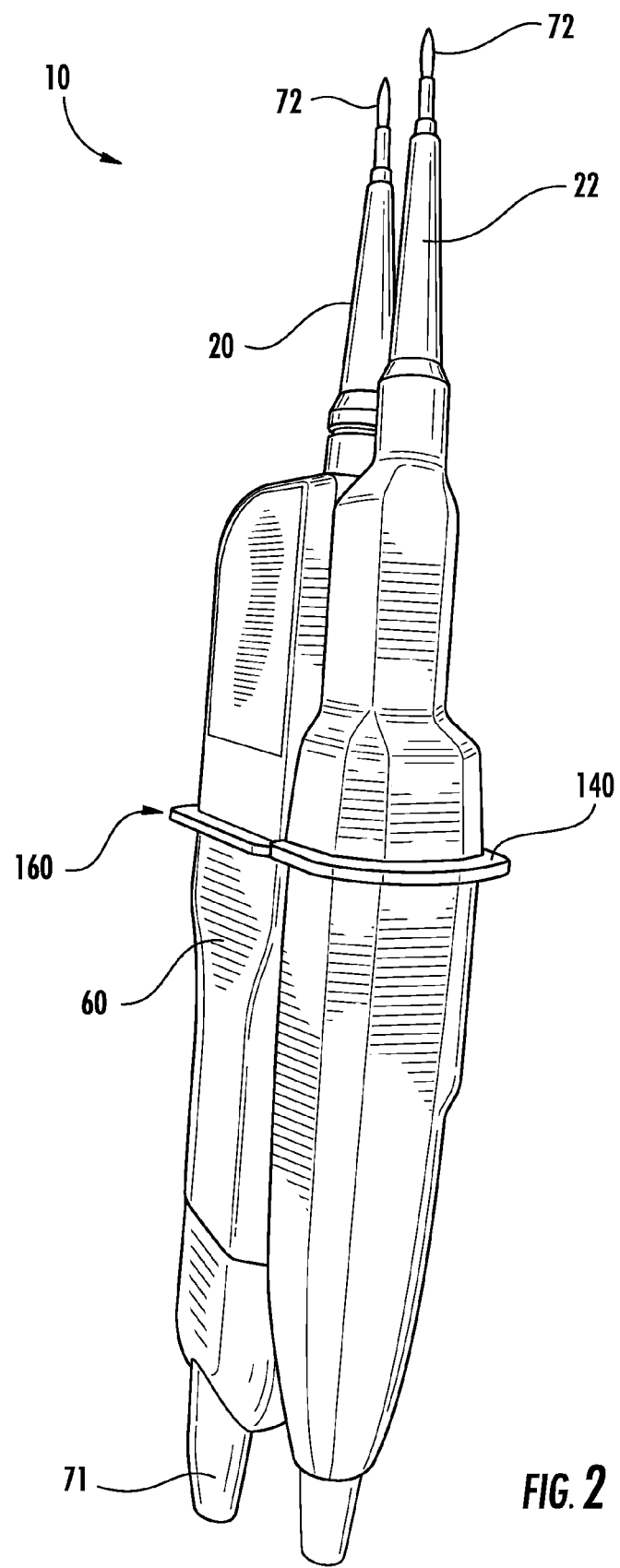
FIG. 2 is perspective view showing the back side and certain other parts of the voltage tester of FIG. 1.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary constructions.

FIG. 1 illustrates a voltage and continuity tester 10 constructed in accordance with the present invention. FIGS. 2-8 illustrate various alternative views of the tester 10. Referring now to FIGS. 1-8, tester 10 comprises a main body 12 and two probes including a main body probe 20 and a removable probe 22. The main body 12 may house circuitry for driving the various functions of the tester 10. For example, the circuitry may enable the tester 10 to function to measure one or more of AC voltage, DC voltage, resistance and/or continuity based on functional options that may be selected using any of various function selector buttons 30 that may be disposed on a front panel 32 of the tester 10. Accordingly, if an operator selects a function selector button corresponding to DC volts, the tester may function as a DC voltmeter and corresponding circuitry for supporting such functionality may be communicatively coupled to the main body probe 20 and the removable probe 22 to support taking DC voltage readings. Similarly, if the operator selects a function selector button corresponding to AC volts, the tester may function as an AC voltmeter and corresponding circuitry for supporting such functionality may be communicatively coupled to the main body probe 20 and the removable probe 22 to support taking AC voltage readings.

In an example embodiment, the front panel 32 may also include a readout panel 40. The readout panel 40 may include a series of lights 42, each of which may be lit based on the values read by the probes of the tester for the selected function. Accordingly, each light in the series of lights 42 may correspond to a specific value such that, if a threshold reading is received, the corresponding light may be lit. In some embodiments, the series of lights 42 may be provided behind corresponding values that may be printed on the readout panel 40 for each respective light. As such, the readout panel 40 may include a series of backlit values that may define a range of sequentially arranged values. The lighting of one of the lights in the series of lights 42 may then provide backlight to make the corresponding value visible or highlighted so that the operator may recognize the reading provided thereby. By providing the series of lights 42 in a backlit configuration relative to the corresponding printed values for each light, it may be easier for the operator to determine the reading than, for example, situations where a light is disposed next to a printed value.

In some embodiments, each of the selector buttons 30 may be a selectable key disposed in the front panel 32 and pressing a key may cause an input to be communicated correspondingly to the tester's printed circuit board (located inside the main body 12). The printed values of the readout panel 40 may, in some cases, be printed on translucent coverings that may extend through apertures in the front panel 32. However, in some cases, the printed values may be provided on a translucent sheet that may cover at least the readout panel 40 or perhaps an entirety or substantial portion of the front panel 32. Lights associated with the series of lights 42 may be associated with respective apertures corresponding to each printed value. In some embodiments, the lights may be light emitting diodes (LEDs) or other light sources.

In an example embodiment, the front panel 32 may also include one or more buttons (e.g., test initiator 50) associated with test functions that enable the circuitry within the main body 12 to perform desirable or required (e.g., based on local regulations) testing. In an example embodiment, a test button 52 may be provided also or alternatively on the removable probe 22. In some cases, testing may require simultaneous activation of the test initiator 50 and/or the test button 52.

In an example embodiment, the main body 12 may include the front panel 32, a back panel 60, a top panel 62, a bottom panel 64, a right side panel 66 and a left side panel 68. Each of the panels may be joined together to define a casing to house the circuitry within the main body 12. In some embodiments, the main body probe 20 may extend out on one of the longitudinal ends of the main body 12 (e.g., the top panel 62). The bottom panel 64 may include corded connection to a bottom portion of a probe body 70 of the removable probe 22 via cord (a portion of which is show as cord 71). The main body probe 20 and the removable probe 22 may each include lead tips 72 at distal ends thereof.

Figure 9:
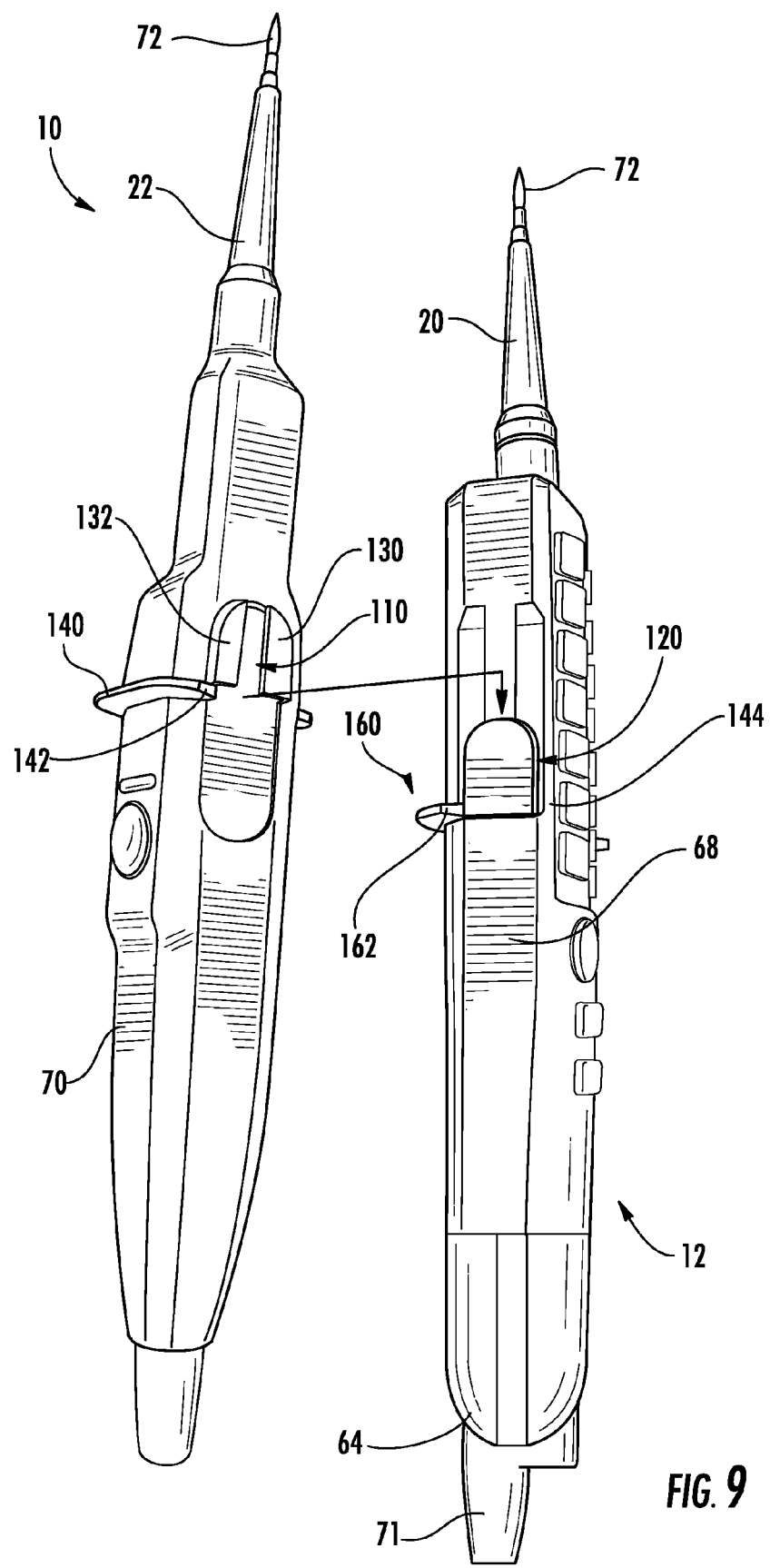
FIG. 9 is a perspective view showing a removable probe connector of the voltage tester according to an example embodiment.
Figure 10:
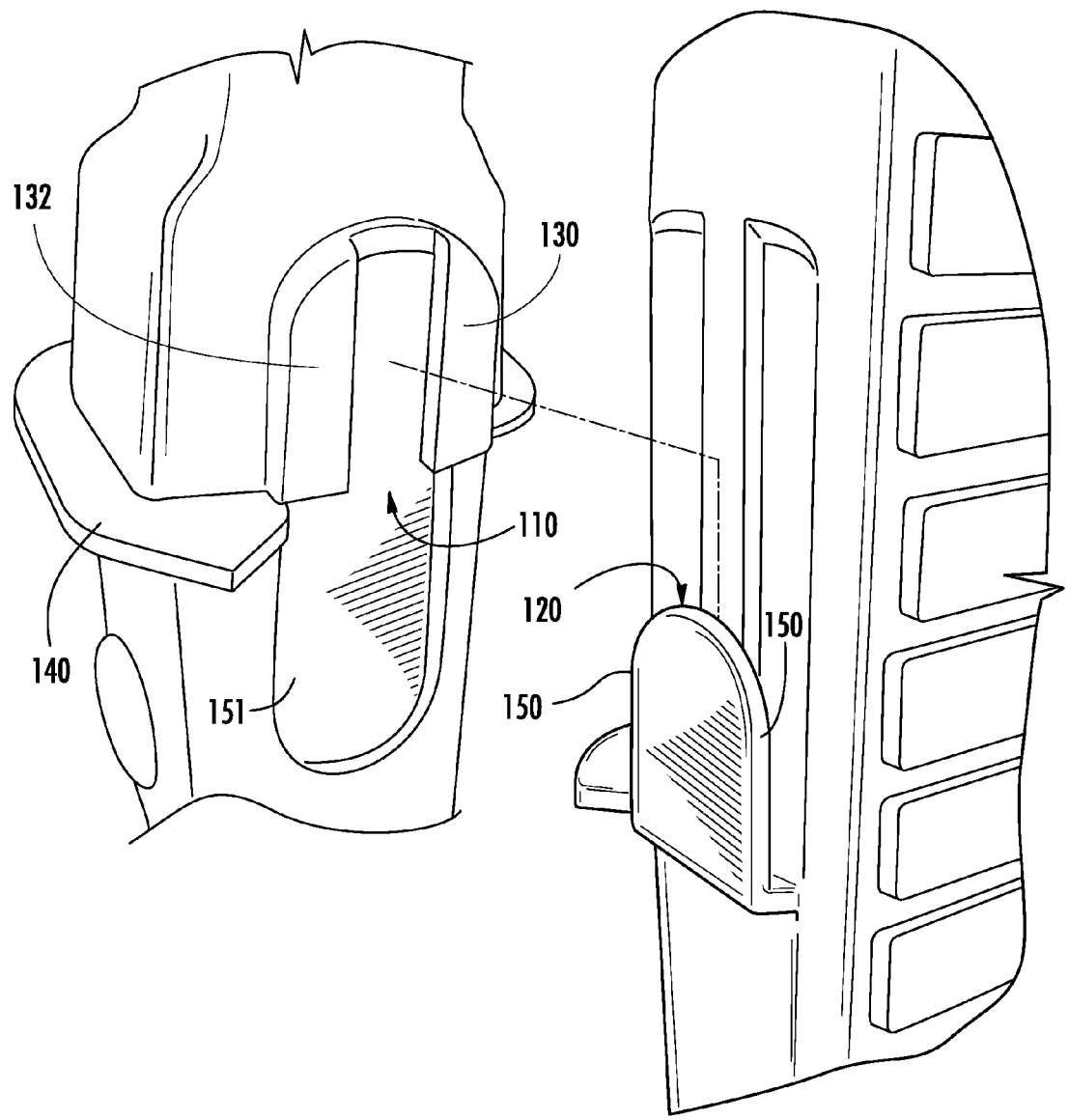
FIG. 10 is a perspective view showing a latch assembly of the voltage tester according to an example embodiment.

Referring now also to FIGS. 9 and 10, the main body probe 20 and the removable probe 22 may be connectable to each other via a latch assembly 100. In an example embodiment, portions of the latch assembly 100 that are located on the removable probe 22 may be disposed at a right side portion of the probe body 70 and portions of the latch assembly 100 that are located on the main body 12 may be disposed at the left side panel 68. However, it should be appreciated that the sides could be switched in some alternative embodiments.

The latch assembly 100 may include a socket 110 configured to receive a mating protrusion 120. In an example embodiment, the socket 110 may be open at one end to receive the mating protrusion 120 via insertion of the mating protrusion 120 into the socket 110 along a direction that is parallel to a longitudinal length of both the main body probe 20 and the removable probe 22. As such, for example, longitudinal lengths of the main body probe 20 and the removable probe 22 may be aligned with each other such that the mating protrusion 120 is disposed proximate to the open end of the socket 110. The mating protrusion 120 may then be slid into the socket 110 to affix the removable probe 22 and the main body probe 20 in position relative to one another.

In an example embodiment, the socket 110 may be disposed on the probe body 70 and the mating protrusion 120 may be disposed on the main body 12 as shown in FIGS. 9 and 10. However, in alternative embodiments, the mating protrusion 120 may be disposed on the probe body 70 and the socket 110 may be disposed on the main body 12. In some embodiments, the socket 110 may include at least a right side sheath body 130 and a left side sheath body 132 that may each extend from opposite sides of the socket 110 outward away from the probe body 70 and then fold toward each other to define a receiving space in the socket 110 to receive the mating protrusion 120. As such, the right side sheath body 130 and the left side sheath body 132 may form a void space that substantially matches a shape of the mating protrusion 120 in some cases. In this regard, mating protrusion 120 may have a T-shaped configuration in which a top planar element is spaced from the main body 12 by a narrower spacer element. The spacer element may have a width slightly less than the gap between right side sheath body 130 and left side sheath body 132. However, it will be appreciated that an exact match of shapes is not required.

In some embodiments, one longitudinal end of the socket 110 may be proximate to an alignment ridge 140. In an example embodiment, the alignment ridge 140 may be disposed on the probe body 70 and may extend radially outward from the probe body 70 to define a ridge (i.e., flange) that lies in a plane that is substantially perpendicular to the longitudinal axis of the removable probe 22. The alignment ridge 140 may extend completely around probe body 70 where it would interfere with use of the socket 110. At least a portion of the alignment ridge 140 may be shaped to support rigid connection between the removable probe 22 and the main body probe 20 when the mating protrusion 120 is inserted into the socket 110. In this regard, for example, the alignment ridge 140 may include an edge (e.g., front edge 142) that fits snugly against a mating surface 144 of the left side panel 68 of the main body probe 12 proximate to the mating protrusion 120. In some cases, the alignment ridge 140 may also function to guard the user's hand from sliding up the removable probe 22.

As noted above, mating protrusion 120 may be configured having a top planar element spaced from main body 12 by a narrower spacer element. Stated another way, the mating protrusion 120 may include cantilevered extension portions 150 that extend from at least two sides (and in some embodiments three sides) of the mating protrusion 120 in order to slide into the socket 110 and engage respective ones of the right side sheath body 130 and the left side sheath body 132. The mating protrusion 120 may otherwise be an extension of the left side panel 68 of the main body 12 that extends in a cantilevered fashion over a portion of the left side panel 68. The cantilevered extension portions 150 may include two portions that extend along a longitudinal length of the main body 12 to correspond to the right side sheath body 130 and the left side sheath body 132 when the mating protrusion 120 is inserted into the socket 110. In some embodiments, a third portion of the cantilevered extension portions 150 may extend between the two portions that extend along a longitudinal length of the main body 12 and may contact or otherwise be proximate to at least a portion of the alignment ridge 140 when the mating protrusion 120 is inserted into the socket 110. As such, the third portion of the cantilevered extension portions 150 may form a base of the mating protrusion that is extended out of the plane in which the left side panel 68 lies. In some cases, the probe body 70 may include a recess 151 that may receive the mating protrusion given that the mating protrusion 120 is in a plane that is parallel to, but spaced apart from the plane of the left side panel 68 by the thickness of the third portion of the cantilevered extension portions 150. A distance between the folded portion of the right and left side sheath bodies 130 and 132 may be slightly larger than a width of the material forming the cantilevered extension portions 150. As such, the mating protrusion 120 may include an arcuate groove around at least two sides of a base thereof to form the cantilevered extension portions 150.

To further stabilize the removable probe 22 when mated with the main body 12, the main body 12 may include a probe support ridge 160. The probe support ridge 160 may extend radially outward from at least a portion of the main body 12 and lie in a plane that is substantially perpendicular to the longitudinal axis of the main body 12. In an example embodiment, the probe support ridge 160 may extend over portions of the right side panel 66, the left side panel 68 and the back panel 60 (see FIGS. 7 and 8). However, the probe support ridge 160 could be less extensive in some examples.

In an example embodiment, the probe support ridge 160 may include a cradle portion 162 shaped to snugly fit next to the probe body 70 when the mating protrusion 120 is inserted into the socket 110. Moreover, the cradle portion 162 may be positioned to support the back of the probe body 70 to inhibit rearward movement of the probe body 70 while the front edge 142 of alignment ridge 140 may be positioned to support the front of the probe body 70 to inhibit forward rotational movement of the probe body 70. Thus, in an example embodiment, the probe support ridge 160 and the alignment ridge 140 may be configured to lie in a same plane perpendicular to the probe axis when the removable probe 20 is mated with the main body 12.

Figure 3:
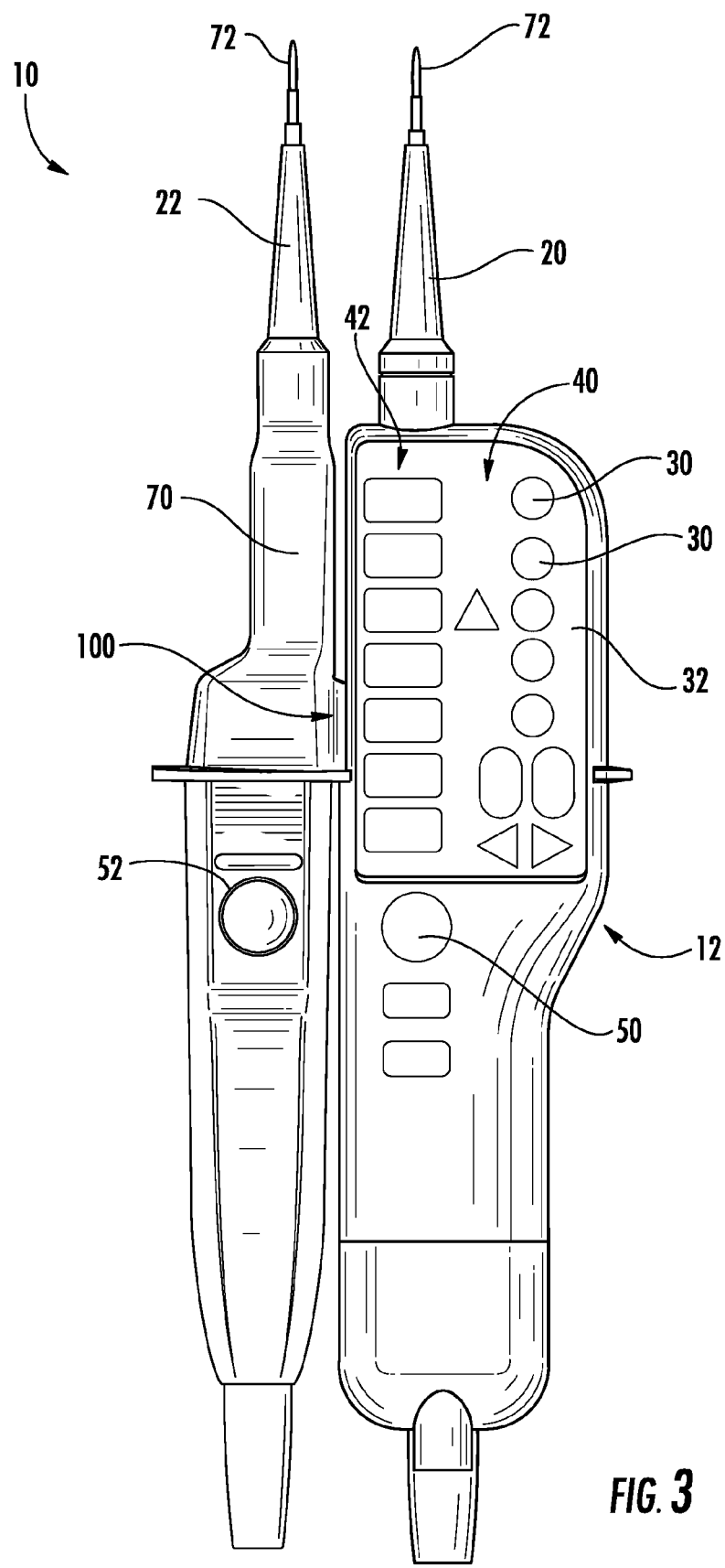
FIG. 3 is a front plan view of the voltage tester of FIG. 1.
Figure 4:
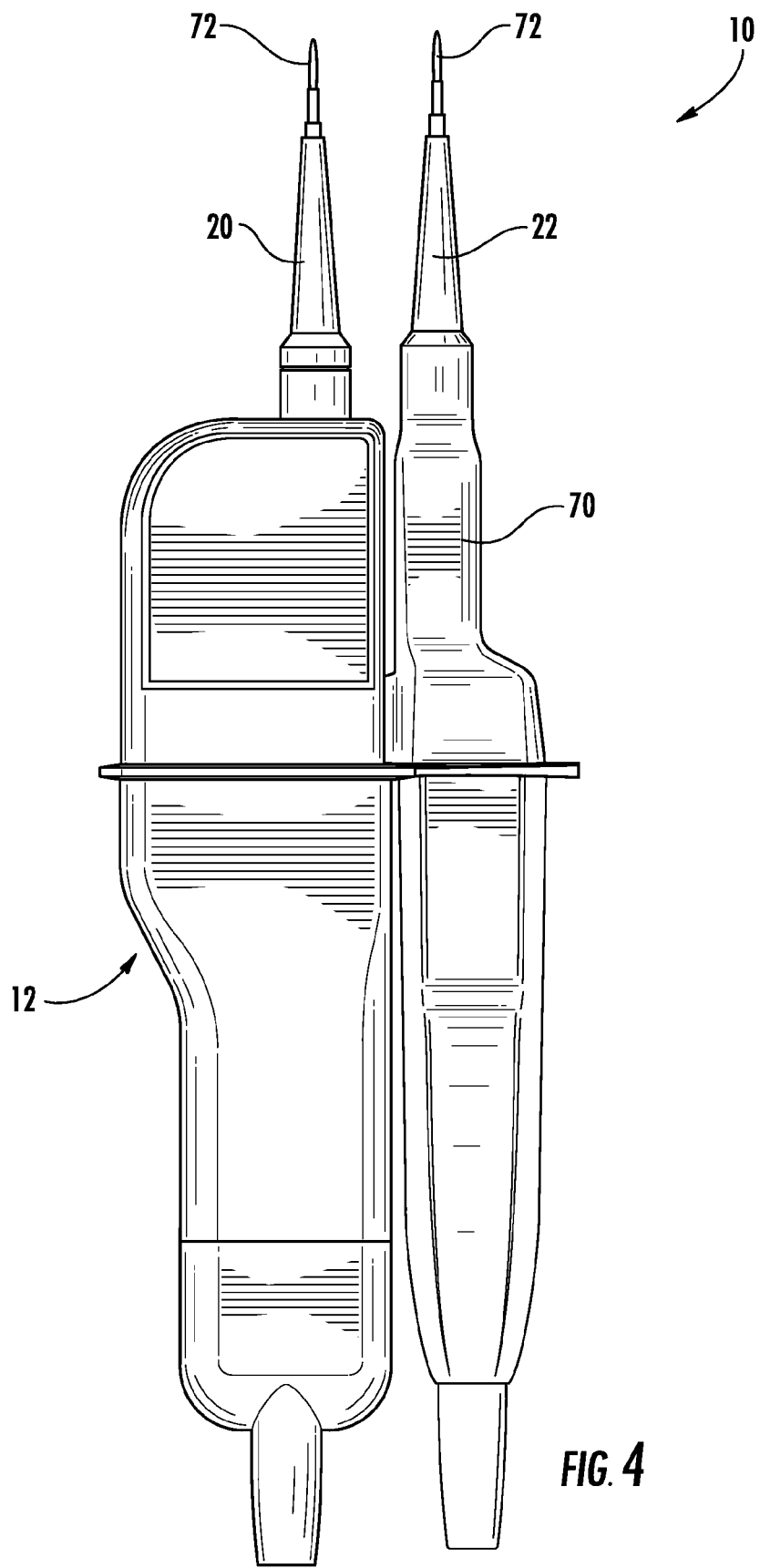
FIG. 4 is a back plan view of the voltage tester of FIG. 1.
Figure 5:
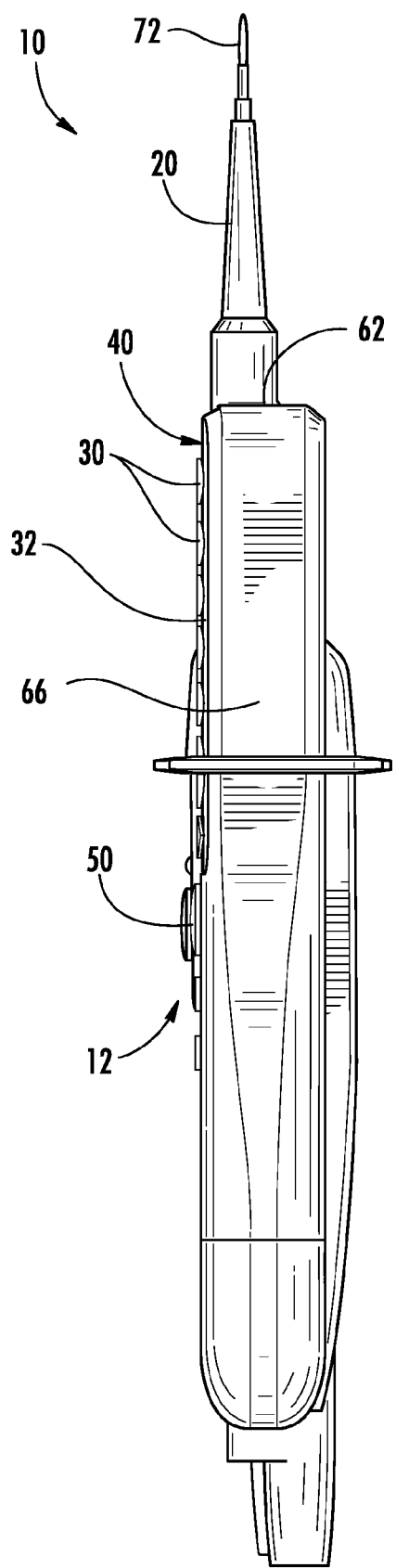
FIG. 5 is a left side plan view of the voltage tester of FIG. 1.
Figure 6:
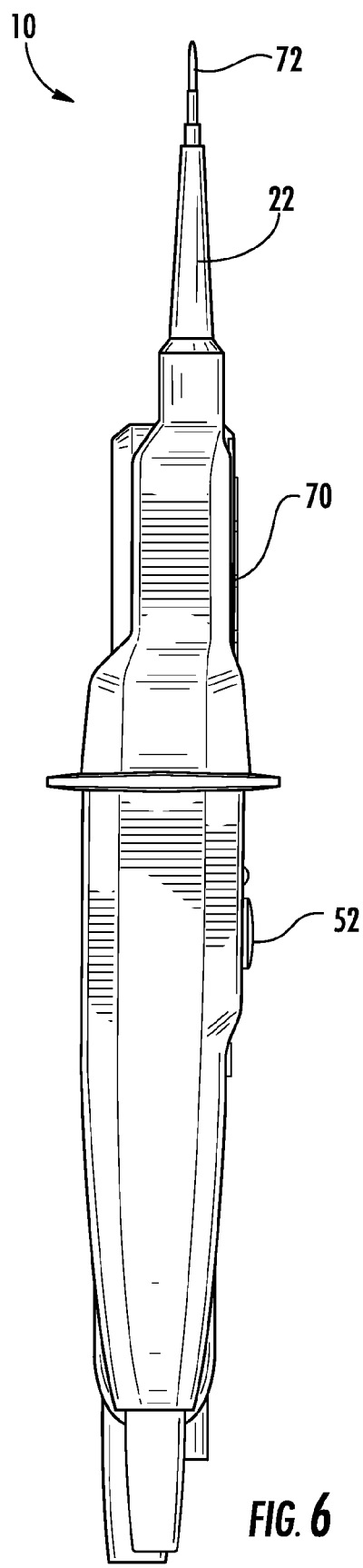
FIG. 6 is a right side plan view of the voltage tester of FIG. 1.
Figure 7:
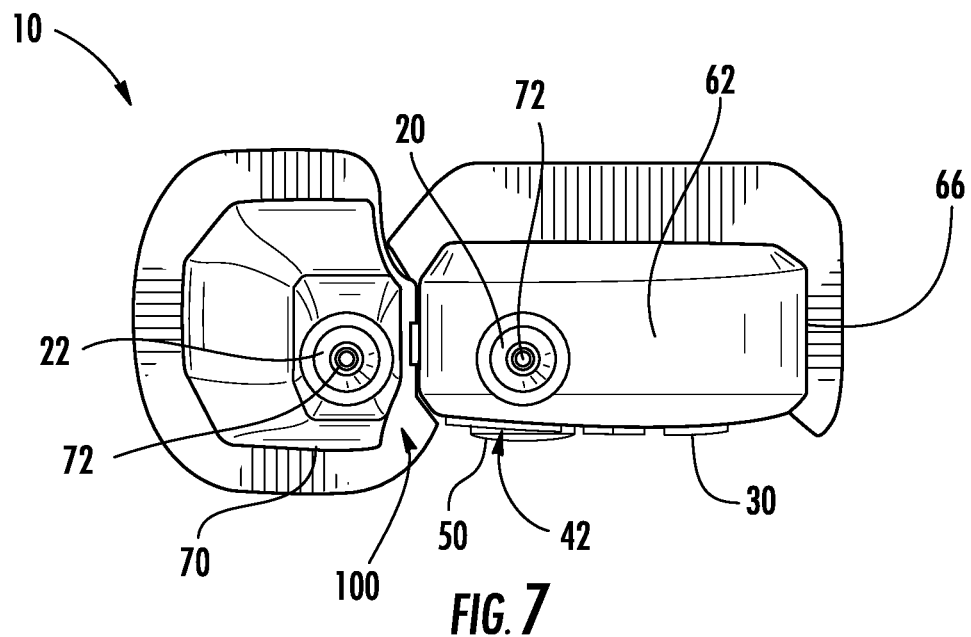
FIG. 7 is a top plan view of the voltage tester of FIG. 1.
Figure 8:
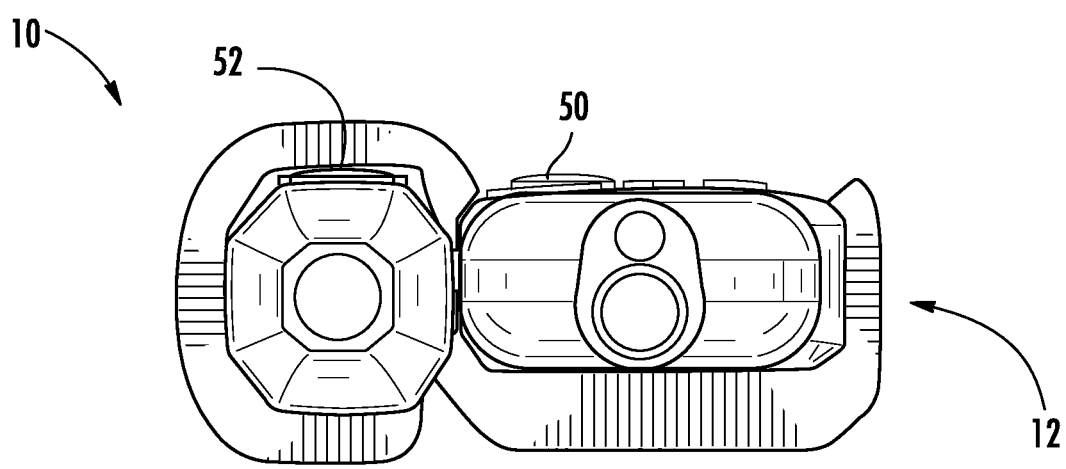
FIG. 8 is a bottom plan view of the voltage tester of FIG. 1.

In some embodiments, a length of the removable probe 22 and the main body probe 20 may be equal. In an example embodiment, the latch assembly 100 may be configured in such a way that when the mating protrusion 120 is inserted into the socket 110, the lead tips 72 are substantially even with each other (i.e., axially aligned) as shown in FIGS. 3 and 4. Moreover, the latch assembly 100 may be configured in such a way that when the mating protrusion 120 is inserted into the socket 110, the lead tips 72 are spaced apart from each other by a predetermined distance. For example, the predetermined distance may be a standard distance between receptacle slots for receiving power plugs. Example embodiments may therefore provide a firm connection between the removable probe 22 and the main body probe 20 and also meet various standard arrangements and testing requirements.

Figure 11:
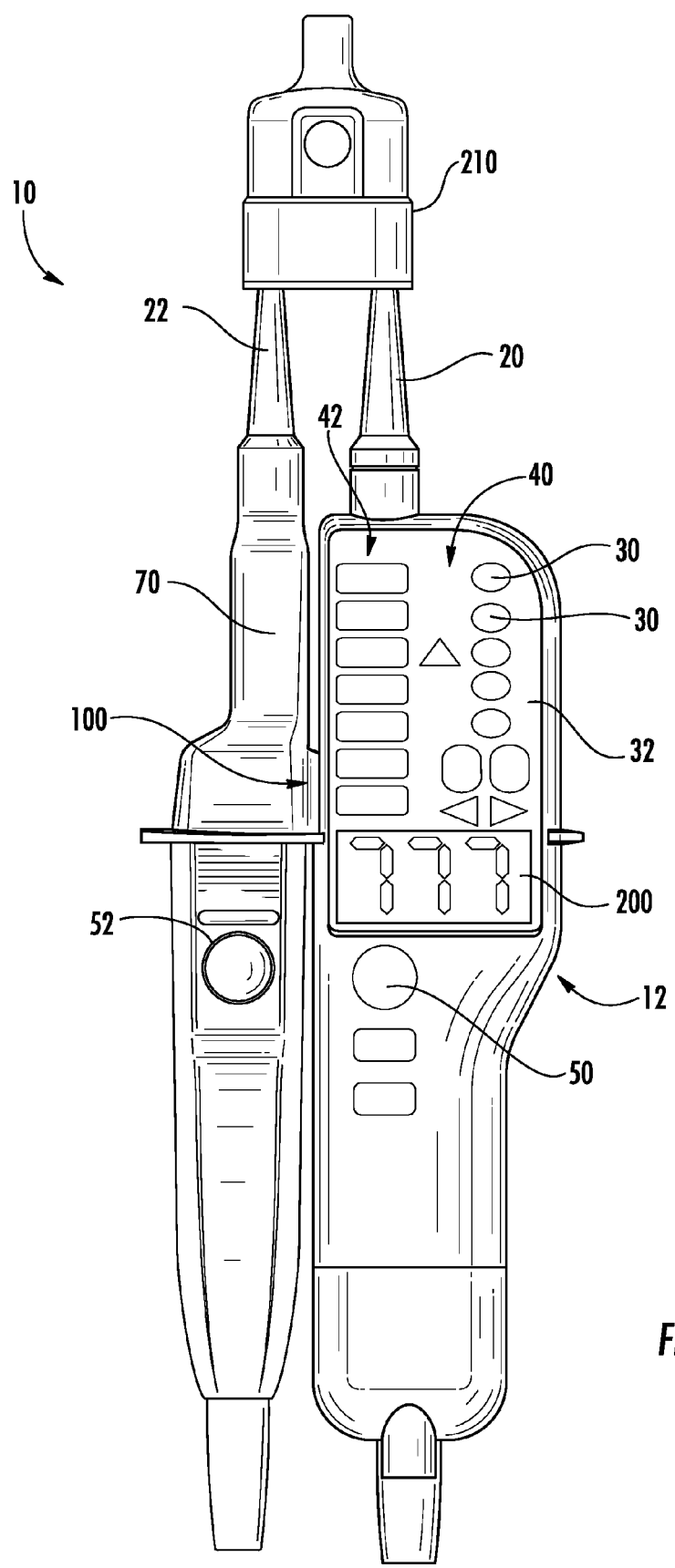
FIG. 11 illustrates a front plan view of an alternative embodiment employing a digital display.

FIG. 11 illustrates a front plan view of an alternative embodiment employing a digital display 200. As can be seen in FIG. 11, the digital display 200 may be provided on the front panel 32. For example, the digital display 200 may show absolute voltage values in addition to the incremental thresholds indicated by series of lights 42. In some embodiments, a cap 210 may also be provided. The lead tips 72 may be inserted into the cap 210 when the mating protrusion 120 is inserted into the socket 110 so that the lead tips 72 are substantially parallel to each other and at approximately the same height. The cap 210 may protect the lead tips 72 and prevent them from getting stuck in cloth or other materials when the tester is not in use.

It can thus be seen that the present invention provides a tester having alternately attachable or separable probes. While preferred embodiments of the invention have been shown and described, modifications and variations may be made thereto by those of ordinary skill in the art without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to be limitative of the invention as further described in the appended claims.

What is claimed is:

1. A tester comprising:
   a main body including a main body probe and a front panel including selectable options for selecting a tester function; and
   a removable probe coupled to the main body via a cord,
   wherein the removable probe is fixable to the main body via a latch assembly, the main body having a probe support ridge associated therewith and the removable probe having an alignment ridge associated therewith, the latch assembly including a socket disposed on one of the removable probe or the main body and a mating protrusion disposed at the other of the removable probe or the main body, the alignment ridge and the probe support ridge lying in a same plane when the mating protrusion is inserted into the socket, wherein the socket comprises a right side sheath body and a left side sheath body that each extend from opposite sides of the socket outward away from the removable probe and then fold toward each other to define a receiving space in the socket to receive the mating protrusion.

2. The tester of claim 1, wherein the front panel includes a readout panel comprising a series of lights that selectably provide backlight to numbered values defined on the readout panel based on readings measured using the main body probe and the removable probe.

3. The tester of claim 1, wherein the front panel and the removable probe each include test feature buttons selectable to initiate test procedures.

4. The tester of claim 1, wherein the front panel includes a digital display.

5. The tester of claim 1, wherein the mating protrusion comprises an arcuate groove disposed around at least two sides of a base thereof to form cantilevered extension portions that at least extend along a longitudinal length of the main body.

6. The tester of claim 1, wherein the alignment ridge is disposed proximate to the socket and extends radially outward from the removable probe in a plane substantially perpendicular to a longitudinal axis of the removable probe.

7. The tester of claim 6, wherein the alignment ridge includes an edge that fits snugly against a mating surface of the main body to inhibit rotational movement of the removable probe when the mating protrusion is disposed in the socket.

8. The tester of claim 1, wherein the probe support ridge extends radially outward from at least a portion of the main body and lies in a plane that is substantially perpendicular to a longitudinal axis of the main body.

9. The tester of claim 8, wherein the probe support ridge extends at least over a back panel of the main body and a side panel of the main body that is proximate to the removable probe when the removable probe is fixed to the main body via the latch assembly.

10. The tester of claim 8, wherein the probe support ridge supports a back portion of the removable probe to inhibit rearward motion of the removable probe when the removable probe is fixed to the main body via the latch assembly.

11. The tester of claim 1, wherein each of the removable probe and the main body probe include corresponding lead tips, and wherein the lead tips of the removable probe and the main body probe are substantially even in a longitudinal direction when the removable probe is fixed to the main body via the latch assembly.

12. The tester of claim 1, wherein each of the removable probe and the main body probe include corresponding lead tips, and wherein the lead tips of the removable probe and the main body probe are disposed a predetermined distance from each other when the removable probe is fixed to the main body via the latch assembly.

13. The tester of claim 12, wherein the predetermined distance corresponds to a distance between receptacle slots for receiving power plugs.

14. A method of assembling a tester comprising:
   providing a main body including a main body probe and a front panel including selectable options for selecting a tester function;
   coupling a removable probe to the main body via a cord; and
   providing a latch assembly to enable fixing the removable probe to the main body, the latch assembly including a socket disposed on one of the removable probe or the main body and a mating protrusion disposed at the other of the removable probe or the main body, the mating protrusion including an arcuate groove disposed around at least two sides of a base thereof, the main body having a probe support ridge associated therewith and the removable probe having an alignment ridge associated therewith, and the alignment ridge and the probe support ridge lying in a same plane when the mating protrusion is inserted into the socket.

15. The method of claim 14, wherein the mating protrusion forms cantilevered extension portions that at least extend along a longitudinal length of the main body.

16. The method of claim 14, wherein providing the latch assembly further comprises providing the socket to include a right side sheath body and a left side sheath body that each extend from opposite sides of the socket outward away from the removable probe and then fold toward each other to define a receiving space in the socket to receive the mating protrusion.

17. A tester comprising:
   a main body including a main body probe and a front panel including selectable options for selecting a tester function, the front panel including a readout panel comprising a series of lights that selectably provide backlight to numbered values defined on the readout panel based on readings measured using the main body probe and the removable probe; and
   a removable probe coupled to the main body via a cord,
   wherein the removable probe is fixable to the main body via a latch assembly, a probe support ridge is disposed on at least one side of the main body, an alignment ridge is disposed on at least one side of the removable probe and extends radially outward in a plane substantially perpendicular to a longitudinal axis of the removable probe, a portion of the latch assembly is disposed on at least one side of the removable probe, and the alignment ridge and the probe support ridge are lying in a same plane when the removable probe is fixed to the main body via the latch assembly.

* * * * *